(12) United States Patent
Ko et al.

(10) Patent No.: US 9,600,424 B2
(45) Date of Patent: Mar. 21, 2017

(54) SEMICONDUCTOR CHIPS, SEMICONDUCTOR CHIP PACKAGES INCLUDING THE SAME, AND SEMICONDUCTOR SYSTEMS INCLUDING THE SAME

(71) Applicant: SK hynix Inc., Icheon-si, Gyeonggi-do (KR)

(72) Inventors: Bok Rim Ko, Seoul (KR); Dong Kyun Kim, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 548 days.

(21) Appl. No.: 14/175,047

(22) Filed: Feb. 7, 2014

(65) Prior Publication Data

US 2015/0067193 A1 Mar. 5, 2015

(30) Foreign Application Priority Data

Sep. 3, 2013 (KR) .................. 10-2013-0105748

(51) Int. Cl.
*G06F 13/16* (2006.01)
(52) U.S. Cl.
CPC .... *G06F 13/16* (2013.01); *H01L 2224/48227* (2013.01); *H01L 2224/49113* (2013.01)

(58) Field of Classification Search
CPC ............ H01L 2224/48227; H01L 2224/49113
See application file for complete search history.

(56) References Cited

U.S. PATENT DOCUMENTS

2006/0060959 A1* 3/2006 Hayashi .................. H01L 22/32
257/697
2014/0246788 A1* 9/2014 Kim .................... H01L 25/0657
257/777

FOREIGN PATENT DOCUMENTS

KR 1020100076809 A 7/2010
KR 1020110109395 A 10/2011

* cited by examiner

*Primary Examiner* — Zachary K Huson
(74) *Attorney, Agent, or Firm* — William Park & Associates Ltd.

(57) ABSTRACT

Semiconductor chips are provided. The semiconductor chip includes a first data pad, a first data strobe pad and a second data pad sequentially arrayed from a command address pad in a first direction. In addition, the semiconductor chip includes a third data pad, a second data strobe pad and a fourth data pad sequentially arrayed from the command address pad in a second direction. Data are inputted and outputted through the first and fourth data pads or through the second and third data pads in a predetermined bit organization. Related semiconductor chip packages and semiconductor systems are also provided.

25 Claims, 3 Drawing Sheets

SEMICONDUCTOR CHIPS, SEMICONDUCTOR CHIP PACKAGES INCLUDING THE SAME, AND SEMICONDUCTOR SYSTEMS INCLUDING THE SAME

CROSS-REFERENCE TO RELATED APPLICATION

The present application claims priority under 35 U.S.C 119(a) to Korean Application No. 10-2013-0105748, filed on Sep. 3, 2013, in the Korean Intellectual Property Office, which is incorporated herein by reference in its entirety as set forth in full.

BACKGROUND

1. Technical Field

Embodiments of the present disclosure relate to semiconductor chips, semiconductor chip packages including the same, and semiconductor systems including the same.

2. Related Art

In the electronics industry, smaller and lighter semiconductor systems are increasingly in demand with the development of semiconductor technologies and the requirement of users. In response to such a demand, multi-chip package techniques have been proposed. According to the multi-chip package techniques, a plurality of semiconductor chips may constitute a single semiconductor package. Thus, a semiconductor system employing the multi-chip packages may have advantages of weight and size as compared with a semiconductor system employing a plurality of single-chip packages (or a plurality of single-die packages).

The multi-chip package may be fabricated by vertically stacking a plurality of semiconductor chips or by horizontally arraying a plurality of semiconductor chips. If a plurality of semiconductor chips are vertically stacked to fabricate the multi-chip package, a planar area that the plurality of semiconductor chips occupy may be reduced. If a plurality of semiconductor chips are horizontally arrayed to fabricate the multi-chip package, a package process for fabricating the multi-chip package may be simplified and a thickness of the multi-chip package may be reduced. Recently, the multi-chip package techniques for vertically stacking a plurality of semiconductor chips have been widely used to realize the smaller and lighter semiconductor systems. The multi-chip package including a couple of semiconductor chips vertically stacked and mounted on a lead frame is referred to a double-die-package (DDP) type semiconductor package.

Each of the semiconductor chips may be designed to have one of various bit organizations such as "×8", "×16", "×32" and the like. A data access time or a data write time of the semiconductor chip may depend on a bit organization. In the event that a semiconductor chip has a bit organization of "×8", eight bits of data may be simultaneously inputted or outputted. In the event that a semiconductor chip has a bit organization of "×16", sixteen bits of data may be simultaneously inputted or outputted. Similarly, in the event that a semiconductor chip has a bit organization of "×32", thirty two bits of data may be simultaneously inputted or outputted.

SUMMARY

Various embodiments are directed to semiconductor chips, semiconductor chip packages including the same, and semiconductor systems including the same.

According to various embodiments, a semiconductor chip includes a first data pad, a first data strobe pad and a second data pad sequentially arrayed from a command address pad in a first direction. In addition, the semiconductor chip includes a third data pad, a second data strobe pad and a fourth data pad sequentially arrayed from the command address pad in a second direction. Data are inputted and outputted through the first and fourth data pads or through the second and third data pads in a predetermined bit organization.

According to various embodiments, a semiconductor chip package includes a first data pad, a first data strobe pad and a second data pad sequentially arrayed from a first command address pad in a first direction; and a third data pad, a second data strobe pad and a fourth data pad sequentially arrayed from a second command address pad in the first direction. The first ball is coupled to the first and second data strobe pads.

According to various embodiments, a semiconductor system includes a controller, a first semiconductor chip and a second semiconductor chip. The controller generates a first data, a first data strobe signal, a second data and a command address signal. The first semiconductor chip includes a first command address pad and a first data pad, a first data strobe pad and a second data pad sequentially arrayed from the first command address pad in a first direction. The second semiconductor chip includes a second command address pad and a fifth data pad, a third data strobe pad and a sixth data pad sequentially arrayed from the second command address pad in the first direction. The first data strobe signal is applied to the first and third data strobe pads.

According to an embodiment of the present invention, a system comprises: a processor; a controller suitable for receiving a request and a data from the processor; and a memory unit suitable for receiving the request and the data from the controller, wherein the memory unit includes: a first data pad, a first data strobe pad and a second data pad sequentially arrayed from a command address pad in a first direction; and a third data pad, a second data strobe pad and a fourth data pad sequentially arrayed from the command address pad in a second direction, wherein data is inputted and outputted through the first and fourth data pads or through the second and third data pads in a predetermined bit organization.

BRIEF DESCRIPTION OF THE DRAWINGS

Embodiments of the present invention will become more apparent in view of the attached drawings and accompanying detailed description, in which.

DETAILED DESCRIPTION

Various embodiments of the present invention will be described hereinafter with reference to the accompanying drawings. However, the embodiments described herein are for illustrative purposes only and are not intended to limit the scope of the present invention.

Figure 1:
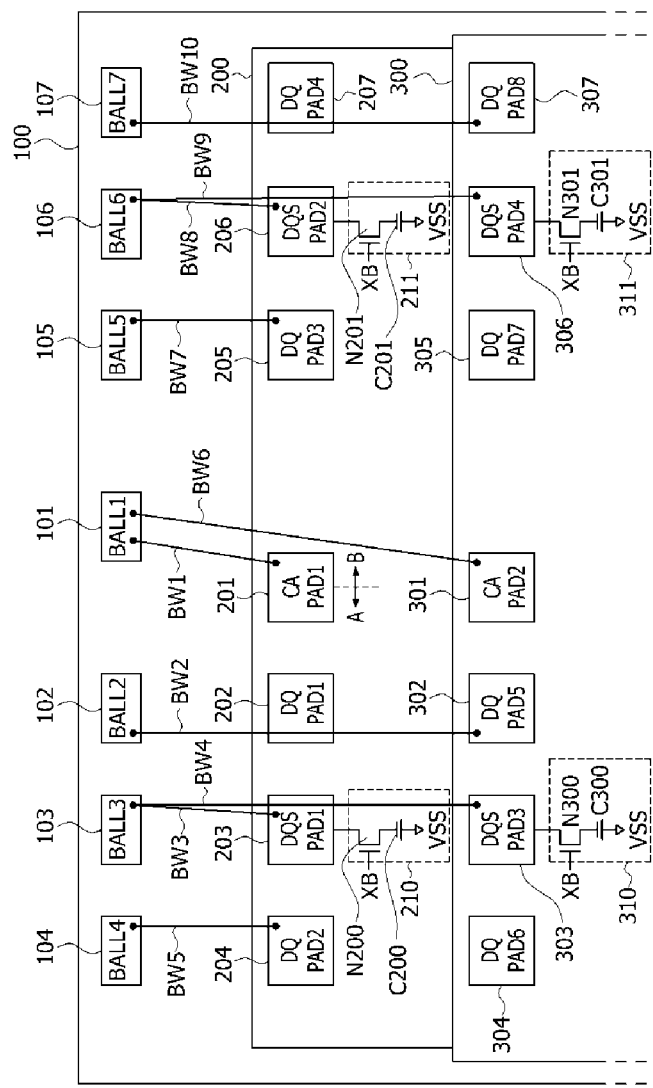
FIG. 1 is a block diagram illustrating a semiconductor chip package according to an embodiment of the present invention.

Referring to FIG. 1, a semiconductor chip package 100 according to an embodiment may include first to seventh balls 101, 102, 103, 104, 105, 106 and 107, a first semiconductor chip 200 and a second semiconductor chip 300. A command signal and an address signal supplied from an external device may be applied to the first and second semiconductor chips 200 and 300 through the first ball 101. The second, fourth, fifth and seventh balls 102, 104, 105 and 107 may be used to receive or output the data. The third and sixth balls 103 and 106 may be used to receive data strobe signals for strobing the data.

The first semiconductor chip 200 may include a first command address pad 201, a first data pad 202, a first data strobe pad 203, a second data pad 204, a third data pad 205, a second data strobe pad 206, a fourth data pad 207, a first input capacitor unit 210 and a second input capacitor unit 211. The first command address pad 201 may be electrically coupled to the first ball 101 through a first bonding wire BW1 to receive the command signal and the address signal. The first data pad 202, the first data strobe pad 203 and the second data pad 204 may be sequentially arrayed from the first command address pad 201 in an "A" direction. The first data strobe pad 203 may be electrically coupled to the third ball 103 through a third bonding wire BW3. The second data pad 204 may be electrically coupled to the fourth ball 104 through a fifth bonding wire BW5. The third data pad 205, the second data strobe pad 206 and the fourth data pad 207 may be sequentially arrayed from the first command address pad 201 in a "B" direction. The "A" direction may be opposite to the "B" direction. The third data pad 205 may be electrically coupled to the fifth ball 105 through a seventh bonding wire BW7. The second data strobe pad 206 may be electrically coupled to the sixth ball 106 through an eighth bonding wire BW8. The first input capacitor unit 210 may include an NMOS transistor N200 and a capacitor C200. The NMOS transistor N200 may be turned off in response to a control signal XB having a logic "low" level to electrically disconnect the first data strobe pad 203 from the capacitor C200 in a predetermined bit organization. That is, the first input capacitor unit 210 may electrically isolate the capacitor C200 in a predetermined bit organization to reduce an input capacitance value of the first data strobe pad 203. The second input capacitor unit 211 may include an NMOS transistor N201 and a capacitor C201. The NMOS transistor N201 may be turned off in response to the control signal XB having a logic "low" level to electrically disconnect the second data strobe pad 206 from the capacitor C201 in a predetermined bit organization. That is, the second input capacitor unit 211 may electrically isolate the capacitor C201 in a predetermined bit organization to reduce an input capacitance value of the second data strobe pad 206. The second ball 102 may be coupled to the fifth data pad 302. Data may be inputted and outputted through the first data pad 202 through the fourth data pad 207 or through the second data pad 204 and the third data pad 205 in a predetermined bit organization. The first semiconductor chip 200 may be suitable for receiving and output data through the second data pad 204 and a third data pad 205 in a predetermined bit organization.

The second semiconductor chip 300 may include a second command address pad 301, a fifth data pad 302, a third data strobe pad 303, a sixth data pad 304, a seventh data pad 305, a fourth data strobe pad 306, an eighth data pad 307, a third input capacitor unit 310 and a fourth input capacitor unit 311. The second command address pad 301 may be electrically coupled to the first ball 101 through a sixth bonding wire BW6 to receive the command signal and the address signal. The fifth data pad 302, the third data strobe pad 303 and the sixth data pad 304 may be sequentially arrayed from the second command address pad 301 in the "A" direction. The fifth data strobe pad 302 may be electrically coupled to the second ball 102 through a second bonding wire BW2. The third data strobe pad 303 may be electrically coupled to the third ball 103 through a fourth bonding wire BW4. The seventh data pad 305, the fourth data strobe pad 306 and the eighth data pad 307 may be sequentially arrayed from the second command address pad 301 in the "B" direction. The "A" direction may be opposite to the "B" direction. The fourth data strobe pad 306 may be electrically coupled to the sixth ball 106 through a ninth bonding wire BW9. The eighth data pad 307 may be electrically coupled to the seventh ball 107 through a tenth bonding wire BW10. The third input capacitor unit 310 may include an NMOS transistor N300 and a capacitor C300. The NMOS transistor N300 may be turned off in response to the control signal XB having a logic "low" level to electrically disconnect the third data strobe pad 303 from the capacitor C300 in a predetermined bit organization. That is, the third input capacitor unit 310 may electrically isolate the capacitor C300 in a predetermined bit organization to reduce an input capacitance value of the third data strobe pad 303. The fourth input capacitor unit 311 may include an NMOS transistor N301 and a capacitor C301. The NMOS transistor N301 may be turned off in response to the control signal XB having a logic "low" level to electrically disconnect the fourth data strobe pad 306 from the capacitor C301 in a predetermined bit organization. That is, the fourth input capacitor unit 311 may electrically isolate the capacitor C301 in a predetermined bit organization to reduce an input capacitance value of the fourth data strobe pad 306. The third ball 103 is connected to the first data strobe pad 203 and the third data strobe pad 303. The first data strobe pad 203 and the third data strobe pad 303 receive a data strobe signal DQS through the third ball 103.

Each of the first data pad 202, the second data pad 204, the third data pad 205 and the fourth data pad 207 included in the first semiconductor chip 200 may be realized to receive and output a single bit signal or a multi-bit signal according to the embodiments. Similarly, each of the fifth data pad 302, the sixth data pad 304, the seventh data pad 305 and the eighth data pad 307 included in the second semiconductor chip 300 may be realized to receive and output a single bit signal or a multi-bit signal according to the embodiments. The second semiconductor chip 300 may be suitable for receiving and output data through the fifth data pad 302 and the eighth data pad 307 in the predetermined bit organization. In order that the semiconductor chip package 100 according to an embodiment has a bit organization of "×16", each of the second data pad 204, the third data pad 205, the fifth data pad 302 and the eighth data pad 307 has to be suitable for receiving and output four bits of data. In such a case, because both the first and third data strobe pads 203 and 303 are electrically coupled to the third ball 103 and both the second and fourth data strobe pads 206 and 306 are electrically coupled to the sixth ball 106 and receive a data strobe signal DQS through the sixth ball, an input capacitance value of each of the first to fourth data strobe pads 203, 206, 303 and 306 may increase. Thus, the first to fourth input capacitor units 210, 211, 310 and 311 may receive the control signal XB having a logic "low" level in a bit organization of "×16" to reduce the input capacitance values of the first to fourth data strobe pads 203, 206, 303 and 306, respectively.

Figure 2:
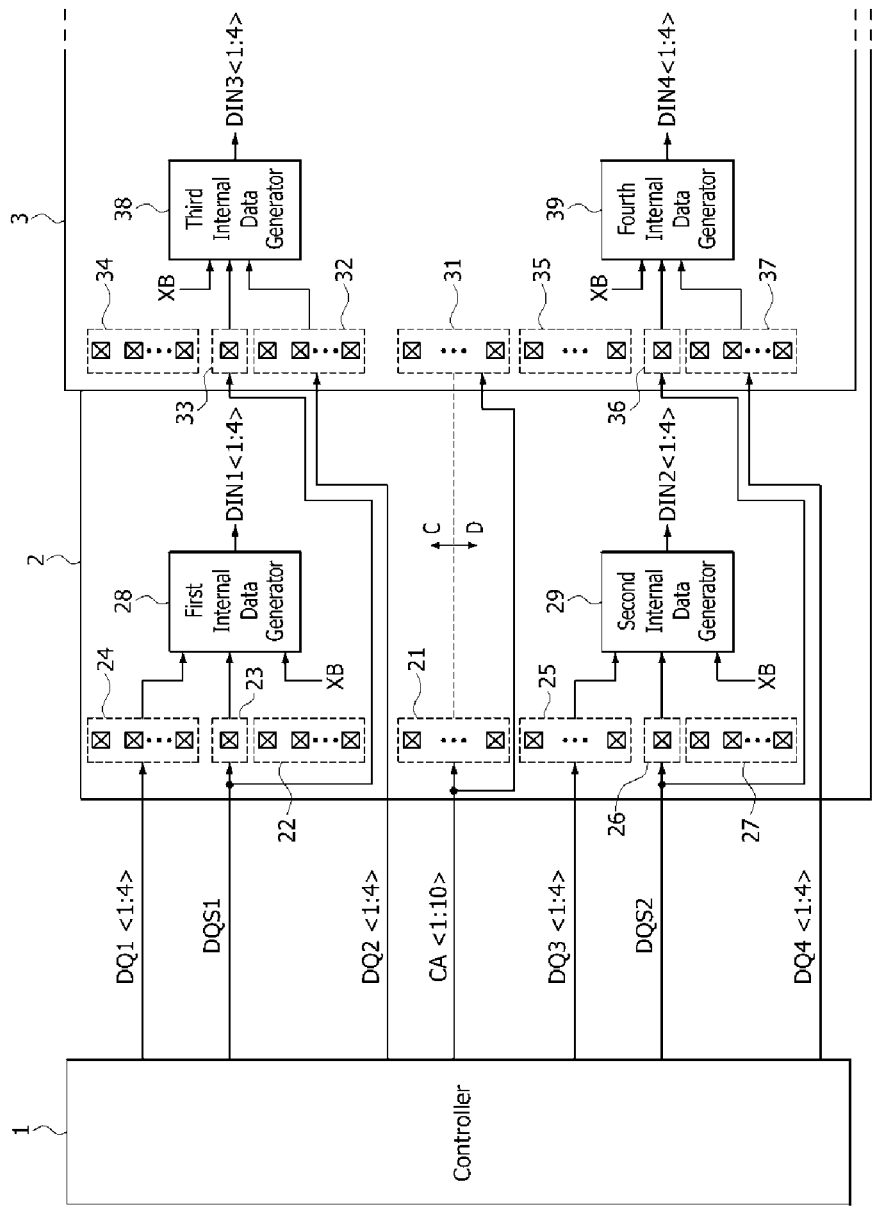
FIG. 2 is a block diagram illustrating a semiconductor system according to an embodiment of the present invention.

Referring to FIG. 2, a semiconductor system according to an embodiment may include a controller 1, a first semiconductor chip 2 and a second semiconductor chip 3. The controller 1 may apply a first data DQ1<1:4>, a first data strobe signal DQS1, a second data DQ2<1:4>, a command address signal CA<1:10>, a third data DQ3<1:4>, a second data strobe signal DQS2 and a fourth data DQ4<1:4> to each of the first and second semiconductor chips 2 and 3. The first semiconductor chip 2 may include a first command address pad portion 21, a first data pad portion 22, a first data strobe pad portion 23, a second data pad portion 24, a third data pad portion 25, a second data strobe pad portion 26, a fourth data pad portion 27, a first internal data generator 28 and a second internal data generator 29. The second semiconductor chip 3 may include a second command address pad portion 31, a fifth data pad portion 32, a third data strobe pad portion 33, a sixth data pad portion 34, a seventh data pad portion 35, a fourth data strobe pad portion 36, an eighth data pad portion 37, a third internal data generator 38 and a fourth internal data generator 39.

The first data pad portion 22, the first data strobe pad portion 23 and the second data pad portion 24 may be sequentially arrayed from the first command address pad portion 21 in a "C" direction. The third data pad portion 25, the second data strobe pad portion 26 and the fourth data pad portion 27 may be sequentially arrayed from the first command address pad portion 21 in a "D" direction. The fifth data pad portion 32, the third data strobe pad portion 33 and the sixth data pad portion 34 may be sequentially arrayed from the second command address pad portion 31 in the "C" direction. The seventh data pad portion 35, the fourth data strobe pad portion 36 and the eighth data pad portion 37 may be sequentially arrayed from the second command address pad portion 31 in the "D" direction. The "C" direction may be opposite to the "D" direction.

The first internal data generator 28 may receive the first data DQ1<1:4> including four bits through the second data pad portion 24 in response to a control signal XB having a logic "low" level in a bit organization of "×16". The first internal data generator 28 may generate first internal data DIN1<1:4> including four bits from the first data DQ1<1:4> in synchronization with the first data strobe signal DQS1 which is inputted through the first data strobe pad portion 23. Moreover, the first internal data generator 28 may be suitable for buffering the first data DQ1<1:4> inputted through the second data pad portion 24 in synchronization with the first data strobe signal DQS1 to generate a first internal data DIN1<1:4> in a predetermined bit organization.

The second internal data generator 29 may receive the third data DQ3<1:4> including four bits through the third data pad portion 25 in response to the control signal XB. The second internal data generator 29 may generate second internal data DIN2<1:4> including four bits from the third data DQ3<1:4> in synchronization with the second data strobe signal DQS2 which is inputted through the second data strobe pad portion 26. The second internal data generator 29 may be suitable for buffering the third data DQ3<1:4> inputted through the third data pad portion 25 in synchronization with the second data strobe signal DSQ1 to generate a second internal data DIN2<1:4> in the predetermined bit organization.

The third internal data generator 38 may receive the second data DQ2<1:4> including four bits through the fifth data pad portion 32 in response to the control signal XB. The third internal data generator 38 may generate third internal data DIN3<1:4> including four bits from the second data DQ2<1:4> in synchronization with the first data strobe signal DQS1 which is inputted through the third data strobe pad portion 33. The third internal data generator 38 may be suitable for buffering the second data DQ2<1:4> inputted through the fifth data pad portion 32 in synchronization with the first data strobe signal DQS1 to generate the third internal data DIN3<1:4> in a predetermined bit organization.

The fourth internal data generator 39 may receive the fourth data DQ4<1:4> including four bits through the eighth data pad portion 37 in response to the control signal XB. The fourth internal data generator 39 may generate fourth internal data DIN4<1:4> including four bits from the fourth data DQ4<1:4> in synchronization with the second data strobe signal DQS2 which is inputted through the fourth data strobe pad portion 36. The fourth internal data generator 39 may be suitable for buffering the fourth data DQ4<1:4> inputted through the eighth data pad portion 37 in synchronization with the second data strobe signal DQS2 to generate the fourth internal data DIN4<1:4> in the predetermined bit organization.

Figure 3:
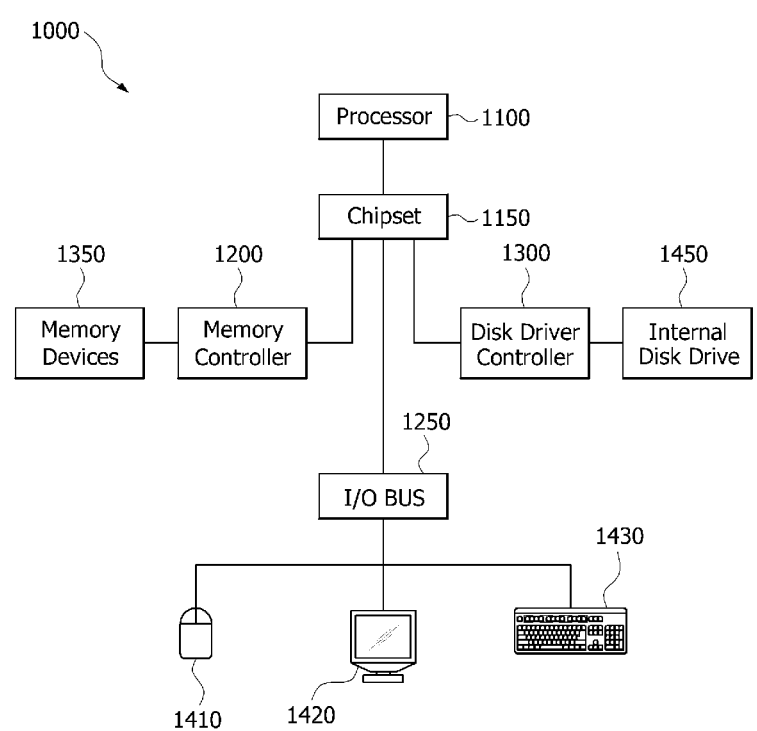
FIG. 3 illustrates a block diagram of a system employing a memory controller circuit in accordance with an embodiment of the present invention.

Referring to FIG. 3, a system 1000 may include one or more processors 1100. A chipset 1150 may be operably coupled to the processor 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably coupled to the chipset 1150. The memory controller 1200 may include at least one memory controller. The memory controller 1200 can receive a request provided by the processor, through the chipset 1150. The memory controller 1200 may be operably coupled to one or more memory devices 1350. The memory devices 1350 may include the semiconductor chip package 100 described above.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be operably coupled to the chipset 1150. The disk drive controller 1300 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

According to the embodiments, when a plurality of semiconductor chips are encapsulated in a single package, data strobe pads included in the plurality of semiconductor chips may be coupled to a single ball and the corresponding data pads included in the plurality of semiconductor chips may be coupled to different balls. Thus, electrical connections between the pads and the balls may be readily realized to obtain a desired bit organization.

What is claimed is:

1. A semiconductor chip comprising:
a first data pad, a first data strobe pad and a second data pad sequentially arrayed from a command address pad in a first direction; and
a third data pad, a second data strobe pad and a fourth data pad sequentially arrayed from the command address pad in a second direction,
wherein data are inputted and outputted through the first and fourth data pads or through the second and third data pads in a predetermined bit organization.

2. The semiconductor chip of claim 1, wherein the first direction and the second direction are opposite to each other.

3. The semiconductor chip of claim 1, further comprising a first input capacitor unit including a first capacitor,
wherein the first input capacitor unit is suitable for electrically disconnecting the first data strobe pad from the first capacitor in the predetermined bit organization.

4. The semiconductor chip of claim 1, further comprising a second input capacitor unit including a second capacitor,
wherein the second input capacitor unit is suitable for electrically disconnecting the second data strobe pad from the second capacitor in the predetermined bit organization.

5. A semiconductor chip package comprising:
a first data pad, a first data strobe pad and a second data pad sequentially arrayed from a first command address pad in a first direction; and
a third data pad, a second data strobe pad and a fourth data pad sequentially arrayed from a second command address pad in the first direction; and
a first ball coupled to the first and second data strobe pads.

6. The semiconductor chip package of claim 5, wherein each of the first and second data strobe pads receive a data strobe signal through the first ball.

7. The semiconductor chip package of claim 6, further comprising:
a second ball coupled to the second data pad; and
a third ball coupled to the third data pad.

8. The semiconductor chip package of claim 7,
wherein a first semiconductor chip is suitable for receiving and output data through the second data pad in a predetermined bit organization; and
wherein a second semiconductor chip is suitable for receiving and output the data through the third data pad in the predetermined bit organization.

9. The semiconductor chip package of claim 5,
wherein a first semiconductor chip further includes a first input capacitor unit including a first capacitor; and
wherein the first input capacitor unit is suitable for electrically disconnecting the first data strobe pad from the first capacitor in a predetermined bit organization.

10. The semiconductor chip package of claim 9,
wherein a second semiconductor chip further includes a second input capacitor unit including a second capacitor; and
wherein the second input capacitor unit is suitable for electrically disconnecting the second data strobe pad from the second capacitor in the predetermined bit organization.

11. The semiconductor chip package of claim 5,
wherein a first semiconductor chip further includes a fifth data pad, a third data strobe pad and a sixth data pad sequentially arrayed from the first command address pad in a second direction; and
wherein a second semiconductor chip further includes a seventh data pad, a fourth data strobe pad and an eighth data pad sequentially arrayed from the second command address pad in the second direction.

12. The semiconductor chip package of claim 11, wherein the first direction and the second direction are opposite to each other.

13. The semiconductor chip package of claim 11, further comprising a second ball coupled to the third and fourth data strobe pads,
wherein each of the third and fourth data strobe pads receives a data strobe signal through the second ball.

14. The semiconductor chip package of claim 13, further comprising:
a third ball coupled to the fifth data pad; and
a fourth ball coupled to the eighth data pad.

15. The semiconductor chip package of claim 14,
wherein the first semiconductor chip is suitable for receiving and output data through the fifth data pad in a predetermined bit organization; and
wherein the second semiconductor chip is suitable for receiving and output the data through the eighth data pad in the predetermined bit organization.

16. A semiconductor system comprising:
a controller suitable for generating a first data, a first data strobe signal, a second data and a command address signal;
a first semiconductor chip suitable for including a first command address pad and a first data pad, a first data strobe pad and a second data pad sequentially arrayed from the first command address pad in a first direction; and
a second semiconductor chip suitable for including a second command address pad to and a third data pad, a second data strobe pad and a fourth data pad sequentially arrayed from the second command address pad in the first direction,
wherein the first data strobe signal is applied to the first and second data strobe pads.

17. The semiconductor system of claim 16, wherein the first semiconductor chip further includes a first internal data generator suitable for buffering the first data inputted through the second data pad in synchronization with the first data strobe signal to generate a first internal data in a predetermined bit organization.

18. The semiconductor system of claim 17, wherein the second semiconductor chip further includes a second internal data generator suitable for buffering the second data inputted through the third data pad in synchronization with the first data strobe signal to generate a second internal data in the predetermined bit organization.

19. The semiconductor system of claim 16, wherein the controller further generates a third data, a second data strobe signal and a fourth data.

20. The semiconductor system of claim 19, wherein the first semiconductor chip is suitable for further including a fifth data pad, a third data strobe pad and a sixth data pad sequentially arrayed from the first command address pad in a second direction.

21. The semiconductor system of claim 20,
wherein the second semiconductor chip is suitable for further including a seventh data pad, a fourth data strobe pad and an eighth data pad sequentially arrayed from the second command address pad in the second direction; and
wherein the second data strobe signal is applied to the third data strobe pad and the fourth data strobe pad.

22. The semiconductor system of claim 21, wherein the first direction and the second direction are opposite to each other.

23. The semiconductor system of claim 21, wherein the first semiconductor chip further includes a third internal data generator suitable for buffering the third data inputted through the fifth data pad in synchronization with the second data strobe signal to generate a third internal data in a predetermined bit organization.

24. The semiconductor system of claim 23, wherein the second semiconductor chip further includes a fourth internal data generator suitable for buffering the fourth data inputted through the eighth data pad in synchronization with the second data strobe signal to generate a fourth internal data in the predetermined bit organization.

25. A system comprising:
  a processor;
  a controller suitable for receiving a request and a data from the processor; and
  a memory unit suitable for receiving the request and the data from the controller,
  wherein the memory unit comprises:
    a first data pad, a first data strobe pad and a second data pad sequentially arrayed from a command address pad in a first direction; and
    a third data pad, a second data strobe pad and a fourth data pad sequentially arrayed from the command address pad in a second direction,
  wherein data are inputted and outputted through the first and fourth data pads or through the second and third data pads in a predetermined bit organization.

* * * * *